United States Patent
Van Duijnhoven et al.

(10) Patent No.: US 10,665,742 B2
(45) Date of Patent: May 26, 2020

(54) CO-EXTRUDED BACKSHEET FOR SOLAR CELL MODULES

(71) Applicant: DSM IP Assets B.V., Heerlen (NL)

(72) Inventors: Franciscus Gerardus Henricus Van Duijnhoven, Echt (NL); Guido Jozefina Wilhelmus Meijers, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 503 days.

(21) Appl. No.: 15/323,517

(22) PCT Filed: Jul. 1, 2015

(86) PCT No.: PCT/EP2015/064938
§ 371 (c)(1),
(2) Date: Jan. 3, 2017

(87) PCT Pub. No.: WO2016/001280
PCT Pub. Date: Jan. 7, 2016

(65) Prior Publication Data
US 2017/0148940 A1    May 25, 2017

(30) Foreign Application Priority Data

Jul. 4, 2014 (EP) .................................. 14175785

(51) Int. Cl.
*H01L 31/049* (2014.01)
*C08J 5/18* (2006.01)
*C08L 51/06* (2006.01)

(52) U.S. Cl.
CPC .............. *H01L 31/049* (2014.12); *C08J 5/18* (2013.01); *C08L 51/06* (2013.01); *C08J 2351/06* (2013.01); *C08J 2423/08* (2013.01); *C08J 2433/14* (2013.01); *C08J 2477/06* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 6,335,479 B1 | 1/2002 | Yamada | |
| 7,271,212 B2 | 9/2007 | Oguni | |
| 9,248,627 B2 | 2/2016 | Pawlik | |
| 2002/0128385 A1 | 9/2002 | Beusen | |
| 2010/0000603 A1 | 1/2010 | Tsuzuki | |
| 2010/0011981 A1 | 1/2010 | Carpenter | |
| 2010/0059105 A1 | 3/2010 | Muckenhuber | |
| 2011/0073164 A1* | 3/2011 | Solis | H01L 31/0481 136/251 |
| 2012/0255611 A1 | 10/2012 | Mikats | |
| 2013/0092226 A1* | 4/2013 | Pawlik | B32B 27/34 136/256 |
| 2013/0092232 A1 | 4/2013 | Pawlik | |
| 2013/0192673 A1 | 8/2013 | Takanashi | |
| 2013/0209795 A1 | 8/2013 | Liu | |
| 2014/0000674 A1 | 1/2014 | Zhao | |
| 2014/0144499 A1 | 5/2014 | Huang | |
| 2014/0332063 A1 | 11/2014 | Devisme | |
| 2015/0311368 A1 | 10/2015 | Libert et al. | |
| 2016/0329445 A1 | 11/2016 | Zhao | |

FOREIGN PATENT DOCUMENTS

| | | |
|---|---|---|
| CN | 102504407 | 6/2012 |
| CN | 102569452 A | 7/2012 |
| CN | 102738275 | 10/2012 |
| CN | 102963090 A | 3/2013 |
| CN | 103057223 | 4/2013 |
| CN | 103158312 A | 6/2013 |
| CN | 102245693 B | 9/2013 |
| CN | 103715287 A | 4/2014 |
| CN | 102983193 B | 9/2015 |
| EP | 2275471 | 1/2011 |
| EP | 2407521 B1 | 7/2015 |
| FR | 2790264 | 9/2000 |
| JP | 2008274261 | 8/2008 |
| JP | 2010502795 | 1/2010 |

(Continued)

OTHER PUBLICATIONS

International Search Report for PCT/EP2015/064938 dated Sep. 23, 2015, 2 pages.
Written Opinion of the ISA for PCT/EP2015/064938 dated Sep. 23, 2015, 4 pages.
D.J. Shanefield, Organic Additives and Ceramic Processing,, Springer Science+Business Media New York, 1195, compares van der Waals bonding as a type of physical bond with ionic, covalent and coordinate covalent types of chemical bonds, Fig 2.1, p. 9.

(Continued)

*Primary Examiner* — Ana L. Woodward
(74) *Attorney, Agent, or Firm* — Kevin M. Bull

(57) ABSTRACT

This invention relates to a solar-cell module backing layer obtained by co-extruding obtained by melt co-extruding (i) a first polymer composition comprising (a) a polyamide, (b) an elastomer and (c) an elastomer that contains groups that bond chemically and/or interact physically with the polyamide, and wherein the first polymer composition comprises from 10 to 90 wt. % of the polyamide (a) and from 10 to 90 wt. % of the elastomer (b) and (c) (of the total weight of polyamide (a) and elastomer (b) and (c) present in the first polymer composition) and (ii) a second polymer composition comprising from 50-98 wt. % of elastomer and from 0.15-5 wt. % of groups (based on the total weight of the second polymer composition) that bond chemically and/or interact physically with the solar cell and optionally with the first polymer composition.

20 Claims, No Drawings

(56) References Cited

FOREIGN PATENT DOCUMENTS

| JP | 2010503033 | 1/2010 |
|---|---|---|
| JP | 2011111558 | 1/2012 |
| JP | 2013512577 | 4/2013 |
| JP | 2013086510 A | 5/2013 |
| JP | 2013089966 | 5/2013 |
| JP | 2014043065 A | 3/2014 |
| KR | 100830133 | 5/2008 |
| WO | WO09048472 | 4/2009 |
| WO | WO2011118727 | 9/2011 |
| WO | WO2013135349 | 9/2013 |
| WO | WO2014021003 A1 | 2/2014 |

OTHER PUBLICATIONS

J.L. Hopton, Knockhardy Notes—A level Chemistry, 1997, is a high school reference page which provides a concise summary of the types of physical bonds that exist; and notes their difference to chemical bonds.

\* cited by examiner

CO-EXTRUDED BACKSHEET FOR SOLAR CELL MODULES

This application is the U.S. national phase of International Application No. PCT/EP2015/064938 filed Jul. 1, 2015 which designated the U.S. and claims priority to EP Patent Application No. 14175785.6 filed Jul. 4, 2014, the entire contents of each of which are hereby incorporated by reference.

The present invention is directed to back sheets for solar cell modules. The present invention also relates to solar cell modules comprising such a back sheet. Further, the present invention relates to a polymer composition that can be used to produce back sheets for solar cell modules.

Solar cell or photovoltaic modules are used to generate electrical energy from sunlight and consist of a laminate which contains a solar cell system as the core layer. This core layer (herein also referred to as solar cell layer) is encapsulated with encapsulating materials which serve as protection against mechanical and weathering-induced influences. These encapsulating materials can consist of one or more layers of plastic films and/or plastic composites.

Because they provide a sustainable energy resource, the use of solar cells is rapidly expanding. The more traditional solar cells are the wafer-based solar cells.

Monocrystalline silicon (c-Si), poly- or multi-crystalline silicon (poly-Si or mc-Si) and ribbon silicon are the materials used most commonly in forming the more traditional wafer-based solar cells. Solar cell modules derived from wafer-based solar cells often comprise a series of self-supporting wafers (or cells) that are soldered together. The wafers generally have a thickness of between about 180 and about 240 micron. Such a panel of solar cells is called a solar cell layer and it may further comprise electrical wirings such as cross ribbons connecting the individual cell units and bus bars having one end connected to the cells and the other exiting the module. The solar cell layer is then further laminated to encapsulant layer(s) and protective layer(s) to form a weather resistant module that may be used for at least 20 years. In general, a solar cell module derived from wafer-based solar cell(s) comprises, in order of position from the front sun-facing side to the back non-sun-facing side: (1) a transparent pane (representing the front sheet), (2) a front encapsulant layer, (3) a solar cell layer, (4) a back encapsulant layer, and (5) a backing layer (or back sheet, representing the rear protective layer of the module).

The encapsulant layers used in solar cell modules are designed to encapsulate and protect the fragile solar cells. Suitable polymer materials for solar cell encapsulant layers typically possess a combination of characteristics such as high impact resistance, high penetration resistance, good ultraviolet (UV) light resistance, good long term thermal stability, adequate adhesion strength to glass and/or other rigid polymeric sheets, high moisture resistance, and good long term weatherability. Currently, ethylene/vinyl acetate copolymers are the most widely used encapsulant material and polyvinylfluoride and polyethylene terephthalate are the most widely used materials for back sheets in the industry.

When solar cell modules are used in the field, it is found that if the encapsulant sheet and the back sheet are not tightly sealed, moisture tends to enter and cause de-lamination and/or breakdown voltage. There is thus still a need to develop an encapsulant and backsheet material having superior adhesion to each other and therefore improve the weatherability of the solar cell module.

In contrast to the prior art, which typically provides multilayered backsheets and adhered thereto a back encapsulant layer, the object of the present invention is to identify suitable materials that can be used for producing a layer for a solar-cell module to be used as backing layer which backing layer is connected to the lower sides of the solar cells. In the present invention, the backing layer integrates the function of the back encapsulant layer and the back sheet in one layer and is to be used as rear layer for a solar-cell module.

This object has been achieved in that the backing layer is obtained or obtainable by melt co-extruding (i) a first polymer composition comprising (a) a polyamide, (b) an elastomer and (c) an elastomer that contains groups that bond chemically and/or interact physically with the polyamide, and wherein the first polymer composition comprises from 10 to 90 wt. % of the polyamide (a) and from 10 to 90 wt. % of the elastomer (b) and (c) (based on the total weight of polyamide (a) and elastomer (b) and (c) present in the first polymer composition) and (ii) a second polymer composition comprising from 50 to 98 wt. % (preferably from 60 to 98 wt. %, more preferably from 70 to 98 wt. %, even more preferably from 80 to 98 wt. %) of elastomer and from 0.15-5 wt. % of groups (based on the weight of the second polymer composition) that bond chemically and/or interact physically with the solar cell and optionally with the first polymer composition. The backing layer is in a single layer form made by melt co-extruding the first and second polymer composition.

It has surprisingly been found that the backing layer as claimed is applicable as rear layer for a solar-cell module and integrates the function of a back encapsulant layer and a back sheet. The use of one layer instead of several layers has several advantages such as no delamination, more simple production of the solar-cell module as at least one layer less needs to be laminated. Further the risk that moisture and/or oxygen enters between the rear backing layer and rear encapsulant layer during the production of the solar cell module is reduced and hence the risk for delamination and/or electrical breakdown is reduced.

The elastomer as mentioned herein means a polymeric compound with a Young's modulus (measured at 23° C. according to ISO 527 1A) of from 2 MPa to 400 MPa. Preferably from 5 to 300 MPa, more preferably from 5 to 200 MPa and even more preferably from 5 to 100 MPa.

Preferably, the polyamide (a) constitutes the continuous phase of the first polymer composition and the elastomers (b) and (c) constitutes the dispersed phase of the first polymer composition and the first polymer composition comprises from 50 to 90 wt. % of the polyamide (a) and from 10 to 50 wt. % of the elastomer (b) and (c) (of the total weight of polyamide (a) and elastomer (b) and (c) present in the first polymer composition). This results in improved dimensional stability (as shown for example by less shrinkage) during the lamination process for preparing the solar cell.

The amount of groups present in the first polymer composition that bond chemically and/or interact physically with the polyamide is preferably from 0.01 to 5 wt. %. The best results are generally achieved with a content of 0.025 to 2 wt. %, preferably from 0.05 to 2 wt. % (based on the total weight of the first polymer composition). The weight ratio of non-functionalized to functionalized elastomer in the first polymer composition may vary within wide limits and is determined in part by the functional groups content of the elastomer and the available reactive groups in the polyamide polymer. Preferably, the amount, in the first polymer composition, of elastomer (c) that contains groups that bond chemically and/or interact physically with the polyamide (functionalized elastomer) is from 5 to 50 wt. % (of the total amount of elastomer (b) and (c) in the first polymer composition).

The polyamide present in the first polymer composition is preferably selected from the group consisting of polyamide-6,6, polyamide-4,6 and polyamide-6 and any mixture thereof; more preferably the polyamide is polyamide-6.

The elastomer (b) of the first polymer composition is preferably a copolymer of ethylene and C3-C12-α-olefin with a density of from 0.85 to 0.93 g/cm$^3$ and a Melt Flow Index (ASTM D1238, 190° C., 2.16 kg) of from 0.5 to 30 g/10 min. More preferably, the elastomer (b) of the first polymer composition is an ethylene-octene copolymer with a density of from 0.85 to 0.93 g/cm$^3$ and a Melt Flow Index (ASTM D1238, 190° C., 2.16 kg) of from 0.5 to 30 g/10 min. Even more preferably, said ethylene-octene copolymer is obtained by polymerization in the presence of a metallocene catalyst since it was found that this results in improved compatibility of the polyamide and the elastomer in the first polymer composition.

The elastomer (c) of the first polymer composition is preferably a copolymer of ethylene and C3-C12-α-olefin with a density of from 0.85 to 0.93 g/cm$^3$ and a Melt Flow Index (ASTM D1238, 190° C., 2.16 kg) of from 0.5 to 30 g/10 min, which copolymer contains groups that bond chemically and/or interact physically with the polyamide. Preferably, the copolymer is an ethylene-octene copolymer with a density of from 0.85 to 0.93 g/cm$^3$ and a Melt Flow Index (ASTM D1238, 190° C., 2.16 kg) of from 0.5 to 30 g/10 min. Even more preferably, said ethylene-octene copolymer is obtained by polymerization in the presence of a metallocene catalyst since this results in improved compatibility of the polyamide and the elastomer in the first polymer composition. The non-functionalized elastomer and the elastomer that is functionalized may be identical or different. An example of a suitable combination is an ethylene-octene copolymer and an ethylene-octene copolymer modified with for instance maleic anhydride.

In the present invention, an elastomer that contains groups that bond chemically and/or interact physically with the polyamide is present in the first polymer composition. Preferably, the first polymer composition comprises functionalized elastomer (c) that contains groups that bond chemically with the polyamide. Preferably, the groups that bond chemically with the polyamide are chosen from the group consisting of anhydrides, acids, epoxides, silanes, isocyanates, oxazolines, thiols and/or (meth)acrylates, with the proviso that the combination of silane and anhydride is preferably excluded, since the presence of silanes in combination with anhydrides may result in gelation of the polymer composition. More preferably, the groups that bond chemically with the polyamide are chosen from the group consisting of unsaturated dicarboxylic acid anhydrides, unsaturated dicarboxylic acids and unsaturated dicarboxylic acid esters and mixtures of the two or more thereof. Even more preferably, the groups that bond chemically with the polyamide are chosen from the group consisting of unsaturated dicarboxylic acid anhydrides. Most preferably, the elastomer that contains groups that bond chemically with the polyamide is obtained by graft polymerizing the elastomer with maleic acid, maleic anhydride and/or fumaric acid, preferably with maleic anhydride.

The groups present in the second polymer composition that bond chemically and/or interact physically with the solar cell are preferably chosen from the functional group consisting of anhydrides, acids, epoxides, silanes, isocyanates, oxazolines, thiols and/or (meth)acrylates, with the proviso that the combination of silane and anhydride is preferably excluded, since the presence of silanes in combination with anhydrides may result in gelation of the polymer composition. More preferably, the groups present in the second polymer composition that bond chemically and/or interact physically with the solar cell are chosen from the group consisting of silanes, epoxides, anhydrides, combination of silanes and epoxides or combination of anhydrides and epoxides. Even more preferably, the groups present in the second polymer composition that bond chemically and/or interact physically with the solar cell are chosen from the group consisting of silanes and epoxides.

In a preferred embodiment, the groups that bond chemically and/or interact physically with the solar cell are introduced in the second polymer composition by blending elastomer that contains such groups into the second polymer composition. This embodiment is preferred since in case introducing the functional groups in another way may result in evaporating of the groups from the second polymer composition.

Preferably, the amount of groups present in the second polymer composition that bond chemically and/or interact physically with the solar cell is from 0.025 to 2 wt. %, preferably from 0.05 to 2 wt. % (of the total weight of the second polymer composition).

Preferably, the elastomer in the second polymer composition is a copolymer of ethylene and C3-C12-α-olefin with a density of from 0.85 to 0.93 g/cm$^3$ and a Melt Flow Index (ASTM D1238, 190° C., 2.16 kg) of from 0.5 to 30 g/10 min. Preferably, the copolymer is an ethylene-octene copolymer with a density of from 0.85 to 0.93 g/cm$^3$ and a Melt Flow Index (ASTM D1238, 190° C., 2.16 kg) of from 0.5 to 30 g/10 min. Even more preferably, said ethylene-octene copolymer is obtained by polymerization in the presence of a metallocene catalyst since this lowers the amount of low Mw species in the ethylene-octene copolymer that is able to migrate and reduce the adhesion property.

Preferably, the elastomer present in the first polymer composition is identical to the elastomer present in the second polymer composition. An example of a suitable elastomer is an ethylene-octene copolymer, preferably an ethylene-octene copolymer as defined hereinabove.

Functional groups can be introduced in the elastomer in many ways. Preferred ways are by chemical modification of the elastomer or by graft polymerization of the elastomer with components containing functional groups as defined hereinabove. Non-limiting and preferred examples of such components are unsaturated dicarboxylic acid anhydrides or an unsaturated dicarboxylic acid or an ester thereof, for instance maleic anhydride, maleic acid, fumaric acid, itaconic acid and itaconic anhydride; unsaturated epoxide such as glycidyl acrylate, for example glycidyl methacrylate; and unsaturated silanes such as for example vinyltrimethoxysilane, vinyltriethoxysilane, vinyltris(beta-methoxyethoxy)silane, gamma-methacryloxypropyltrimethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane or mixtures of two or more thereof.

The first and second polymer composition used herein may further comprise one or more other polymers. Such optional polymer(s) may be present in an amount of up to about 25 wt percent, based on the total weight of the polymer composition, provided that the inclusion of such optional polymer(s) does not adversely affect the desirable performance characteristics of the backing layer obtained by melt co-extruding the first and second polymer composition, such as the adhesion properties and the integrated function of back encapsulant layer and back sheet.

The first and second polymer composition may further comprise additives known within the art. The first and second polymer composition preferably comprise at least one additive selected from UV stabilizers, UV absorbers, anti-oxidants, thermal stabilizers and/or hydrolysis stabilisers. When such additives stabilizers are used, the polymer composition contains from 0.05 wt. % percent to 10 wt. %, more preferably to 5 wt. %, based on the total weight of the polymer composition. Through the selection of the polyamide, the elastomer and the functional groups of the first and second polymer composition from the described types and amounts, and the optional addition of one or more of these additives, the layer obtained by melt co-extruding the first and second polymer composition fulfills all essential requirements for solar-cell module backing layer, such as weathering stability (UV and hydrolysis resistance), heat resistance, mechanical protection, electrical insulation and good adhesion.

White pigments such as TiO2, ZnO or ZnS may be added to the to one or both layers to increase backscattering of sunlight leading to increased efficiency of the PV module. Black pigments such as carbon black may be added to one or both layers for esthetic reasons.

The thickness of the solar-cell module backing layer is preferably from 0.1 to 1 mm, more preferably from 0.1 to 0.8 mm, even more preferably from 0.1 to 0.75 mm.

The solar-cell module backing layer according to the invention is obtained by melt co-extruding of the first and second polymer composition. The process for melt co-extruding of the first and second polymer composition comprises the following steps:
a) Preparing the first polymer composition by mixing the components,
b) Preparing the second polymer composition by mixing the components,
c) Melting of the first polymer composition to obtain a first melt stream,
d) Melting of the second polymer composition to obtain a second melt stream,
e) Combining the melt streams by co-extrusion in one extrusion die,
f) Cooling the co-extruded layer.

Preferably steps a)-d) are effected in an extruder. When effecting steps a)-d) in an extruder, the thickness of the first melt stream is preferably from 0.05 to 0.8 mm, more preferably from 0.05 to 0.7 mm, even more preferably from 0.05 to 0.5 mm and the thickness of the second melt stream is preferably from 0.05 to 0.95 mm, more preferably from 0.05 to 0.75 mm, even more preferably from 0.05 to 0.7 mm.

In a preferred embodiment, the thickness of the solar-cell module backing layer is from 0.1 to 1 mm, whereby the thickness of the first melt stream is from 0.05 to 0.8 mm and the thickness of the second melt stream is from 0.05 to 0.95 mm. In another preferred embodiment, the thickness of the solar-cell module backing layer is from 0.1 to 0.8 mm, whereby the thickness of the first melt stream is from 0.05 to 0.7 mm and the thickness of the second melt stream is from 0.05 to 0.75 mm. In another preferred embodiment, the thickness of the solar-cell module backing layer is from 0.1 to 0.75 mm, whereby the thickness of the first melt stream is from 0.05 to 0.5 mm and the thickness of the second melt stream is from 0.05 to 0.7 mm.

The present invention further relates to the use of the co-extruded sheet as described herein above as backing layer for a solar cell module, characterized in that the backing layer is the rear layer of the solar-cell module and the backing layer is connected to the lower sides of the solar cells.

The present invention further relates to a solar-cell module containing essentially, in order of position from the front-sun facing side to the back non-sun-facing side, a transparent pane, a front encapsulant layer, a solar cell layer comprised of one or more electrically interconnected solar cells, and a backing layer, wherein the backing layer is connected to the lower sides of the solar cells, characterized in that the backing layer is as defined herein above and is positioned in such a way that the first polymer composition is at the back non-sun facing side of the module. The solar cells in the solar cell layer may be any kind of solar cells, such as thin-film solar cells (for example copper indium gallium selenide solar cells and cadmium telluride solar cells) and wafer-based solar cells.

The present invention further relates to a process for preparing such solar cell module, which process comprises (a) providing an assembly comprising all the components layers recited above and (b) laminating the assembly to form the solar cell module. The laminating step of the process may be conducted by subjecting the assembly to heat and optionally vacuum or pressure.

The present invention further relates to a polymer composition comprising (a) a polyamide, (b) an elastomer and (c) an elastomer that contains groups that bond chemically and/or interact physically with the polyamide, and wherein the first polymer composition comprises from 10 to 90 wt. % of the polyamide (a) and from 10 to 90 wt. % of the elastomer (b) and (c) (of the total weight of polyamide (a) and elastomer (b) and (c) present in the first polymer composition). Preferred embodiments for such a polymer composition are described herein above.

The invention is now demonstrated by means of a series of examples and comparative experiments.

TABLE 1

| Materials used | Description |
| --- | --- |
| ICOSOLARO ® AAA 3554 obtained from Isovoltaic | Laminate of 3 polyamide layers |
| ICOSOLAR ® 2442 obtained from Isovoltaic | Laminate of 3 layers: polyvinyl fluoride-polyethylene terephtalate-polyvinyl fluoride |
| APOLHYA ® Solar R333A obtained from Arkema | Polyolefin back encapsulant-polyethylene with grafted polyamide |
| EVASKY ™ from Bridgestone | Ethylene-vinyl acetate copolymer |
| Akulon ® K122 from DSM | Polyamide-6 |
| Cupper Iodide powder obtained from BASF | Thermal stabilizer |

TABLE 1-continued

| Materials used | Description |
| --- | --- |
| Irganox ® 1098 obtained from BASF | Anti-oxidant |
| Queo ™ 1007 obtained from Borealis Plastomers | LLDPE (ethylene based octene elastomer) with density of 910 g/cm$^3$ and MFI of 7 |
| Queo ™ 8201 obtained from Borealis Plastomers | LLDPE (ethylene based octene elastomer) with density of 882 g/cm$^3$ and MFI of 1 |
| Methacryloxy propyl trimethoxy silane obtained from BRB | |
| Lotader ® AX8840 obtained from Arkema | Random copolymer of ethylene and glycidyl methacrylate (epoxy functional elastomer) |
| Fusabond ® N 525 obtained from DuPont | Anhydride modified ethylene copolymer (elastomer) |
| Glass plate from Centro Solar | SECURIT EN12150 |

COMPARATIVE EXPERIMENT A

This example is a reference and only commercial encapsulant and backsheet films were used.

A laminate was made by making the following stack: 1) ICOSOLAR® AAA 3554, 2) APOLHYA® Solar R333A, 3) one standard multi-crystalline solar cell, 4) APOLHYA® Solar R333A, 5) glass plate of 20 by 30 cm. Lamination was done at 157° C. during 12 minutes.

Samples were aged in a climate chamber at 85° C. and 85% relative humidity. Samples were exposed to a damp heat test.

It was visually assessed that the sample showed no delamination during 3000 hours of ageing. It was assessed after 3000 hours of ageing, by hand, that the layer of ICOSOLAR® AAA 3554 became brittle between 2000 and 3000 hours of ageing. Flash testing did not show any significant decrease of the power output after 2000 hours of ageing.

COMPARATIVE EXPERIMENT B

This example is a reference and only commercial encapsulant and backsheet films were used.

A laminate was made by making the following stack: 1) ICOSOLAR® AAA 3554, 2) EVASKY™, 3) one standard multi-crystalline solar cell, 4) EVASKY™5) glass plate of 20 by 30 cm. Lamination was done at 157° C. during 12 minutes.

Samples were aged in a climate chamber at 85° C. and 85% relative humidity. Samples were exposed to a damp heat test.

It was visually assessed that the sample showed no delamination during 3000 hours of ageing. It was assessed after 3000 hours of ageing, by hand, that the layer of ICOSOLAR® AAA 3554 became brittle between 2000 and 3000 hours of ageing. Flash testing did not show any significant decrease of the power output after 2000 hours of ageing.

COMPARATIVE EXPERIMENT C

This example is a reference and only commercial encapsulant and backsheet films were used.

A laminate was made by making the following stack: 1) ICOSOLAR® 2442, 2) EVASKY™, 3) one standard multi-crystalline solar cell, 4) EVASKY™, 5) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. It was assessed after 3000 hours of ageing, by hand, that the layer of ICOSOLAR® 2442 became very brittle between 2000 and 3000 hours of ageing. Flash testing did not show any significant decrease of the power output after 2000 hours of ageing.

COMPARATIVE EXPERIMENT D

This example is a reference experiment for which no adjustments have been done to the bottom "backsheet" layer. Two different compounds were made on a ZSK25 extruder. The first compound contained 96.85 wt % Akulon® K122, 0.15 wt % Cupper Iodide, and 3 wt % Irganox® 1098. The second compound contained 65 wt % Queo™ 1007, 25 wt % Queo™ 1007 to which 2 wt % methacryloxy propyl trimethoxy silane (BRB) is grafted and 10 wt % Lotader® AX8840. From the first compound a 200 micrometer film was made via film-extrusion. From the second compound a 500 micrometer film was made via film-extrusion.

A laminate was made by making the following stack: 1) film of compound 1 2) film of compound 2 3) one standard multi-crystalline solar cell 4) APOLHYA® Solar R333A 5) glass plate of 20 by 30 cm. Lamination was done at 157° C. during 12 minutes.

Samples were aged in a climate chamber at 85° C. and 85% relative humidity.

It was visually assessed that the sample showed clear delamination at the side of the glass, which became significant during 3000 hours of ageing. Consequently, the IEC norm. was not met.

EXAMPLE 1

Two different compounds were made on a ZSK25 extruder. The first compound contained 50 wt % Akulon® K122, 34.85 wt % Queo™ 8201, 10 wt % Fusabond N525, 0.15 wt % Cupper Iodide, and 3 wt % Irganox® 1098. The second compound contained 65 wt % Queo™ 1007, 25 wt % Queo™ 1007 to which 2 wt % methacryloxy propyl trimethoxy silane (BRB) is grafted and 10 wt % Lotader® AX8840 (Arkema). A film was made by co-extrusion a 200 micrometer film of compound 1 with a 500 micrometer film of compound 2. The extrusion die was set at a temperature of 250° C.

A laminate was made by making the following stack: 1) above co-extruded film, 2) one standard multi-crystalline solar cell, 3) APOLHYA® Solar R333A, 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 2

The same compounds as produced in example 1 were co-extruded into a film having a total thickness of 600 micrometers and consisting of a 400 micrometer layer of the first compound and a 200 micrometer layer of the second compound. The extrusion die was set at a temperature of 270° C.

A laminate was made by making the following stack: 1) above co-extruded film, 2) one standard multi-crystalline solar cell, 3) APOLHYA® Solar R333A, 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 3

Two different compounds were made on a ZSK25 extruder. The first compound contained 50 wt % Akulon® K122, 34.85 wt % Queo™ 8201, 10 wt % Fusabond® N 525, 0.15 wt % Cupper Iodide, and 3 wt % Irganox® 1098. The second compound contained 90 wt % Queo™ 1007 and 10 wt % Lotader® AX8840. A film was made by co-extrusion a 200 micrometer film of compound 1 with a 500 micrometer film of compound 2. The extrusion die was set at a temperature of 250° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 4

The same compounds as produced in example 3 were co-extruded into a film having a total thickness of 600 micrometers and consisting of a 400 micrometer layer of the first compound and a 200 micrometer layer of the second compound. The extrusion die was set at a temperature of 270° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes. Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 5

Two different compounds were made on a ZSK25 extruder. The first compound contained 50 wt % Akulon® K122, 40 wt % Queo™ 8201, 10 wt % Fusabond® N 525. The second compound contained 65 wt % Queo™ 1007, 25 wt % Queo™ 1007 to which 2 wt % methacryloxy propyl trimethoxy silane (BRB) is grafted and 10 wt % Lotader® AX8840 (Arkema). A film was made by co-extrusion a 200 micrometer film of compound 1 with a 500 micrometer film of compound 2. The extrusion die was set at a temperature of 250° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 6

The same compounds as produced in example 5 were co-extruded into film having a total thickness of 600 micrometers and consisting of a 400 micrometer layer of the first compound and a 200 micrometer layer of the second compound. The extrusion die was set at a temperature of 270° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

EXAMPLE 7

Two different compounds were made on a ZSK25 extruder. The first compound contained 50 wt % Akulon® K122, 34.85 wt % Queo™ 8201, 10 wt % Fusabond® N 525, 0.15 wt % Cupper Iodide, and 3 wt % Irganox® 1098. The second compound contained 67.5 wt % Queo™ 1007, 22.5 wt % Queo™ 1007 to which 2 wt % methacryloxy propyl trimethoxy silane (BRB) is grafted and 10 wt % Fusabond® N 525. A film was made by co-extrusion a 200 micrometer film of compound 1 with a 500 micrometer film of compound 2. The extrusion die was set at a temperature of 250° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes.

Samples were aged in a climate chamber at 85° C. and 85% relative humidity.

It was visually assessed that the sample showed clear delamination during 3000 hours of ageing. Flash testing did not show any significant decrease of the power output after 3000 hours of ageing.

EXAMPLE 8

The same compounds produced in example 7 were co-extruded into film having a total thickness of 600 micrometers and consisting of a 400 micrometer layer of the first compound and a 200 micrometer layer of the second compound. The extrusion die was set at a temperature of 270° C.

A laminate was made by making the following stack: 1) above co-extruded film, 2) one standard multi-crystalline solar cell 3) APOLHYA® Solar R333A 4) glass plate of 20 by 30 cm. Lamination was done at 157° C. during 12 minutes.

Samples were aged in a climate chamber at 85° C. and 85% relative humidity.

It was visually assessed that the sample showed no delamination during 3000 hours of ageing. Flash testing did not show any significant decrease of the power output after 3000 hours of ageing.

The invention claimed is:

1. A solar-cell module backing layer obtained by melt co-extruding (i) a first polymer composition comprising (a) a polyamide, (b) a non-functionalized elastomer and (c) a functionalized elastomer that contains groups that bond chemically and/or physically with the polyamide, and wherein the first polymer composition comprises from 10 to 90 wt. % of the polyamide (a) and from 10 to 90 wt. % of the non-functionalized elastomer (b) and the functionalized elastomer (c) (of the total weight of polyamide (a), non-functionalized elastomer (b) and functionalized elastomer (c) present in the first polymer composition) and (ii) a second polymer composition comprising from 50 to 98 wt. % of an elastomer and from 0.15-5 wt. % of groups (based on the total weight of the second polymer composition) that bond chemically and/or physically with a solar cell and optionally with the first polymer composition.

2. The backing layer according to claim 1, wherein the polyamide (a) constitutes the continuous phase of the first polymer composition and the non-functionalized elastomer (b) and functionalized elastomer (c) constitute the dispersed phase of the first polymer composition and wherein the first polymer composition comprises from 50 to 90 wt. % of the polyamide (a) and from 10 to 50 wt. % of the non-functionalized elastomer (b) and the functionalized elastomer (c) (of the total weight of polyamide (a) non-functionalized elastomer (b) and functionalized elastomer (c) present in the first polymer composition).

3. The backing layer according to claim 1, wherein the amount, in the first polymer composition, of functionalized elastomer (c) that contains groups that bond chemically and/or physically with the polyamide is from 5 to 50 wt. % (of the total weight of non-functionalized elastomer (b) and functionalized elastomer (c) in the first polymer composition).

4. The backing layer according claim 1, wherein the polyamide is selected from the group consisting of polyamide-6,6, polyamide-4,6, polyamide-6, and any mixture thereof.

5. The backing layer according to claim 1, wherein the non-functionalized elastomer (b) in the first polymer composition is a copolymer of ethylene and C3-C12-α-olefin with a density of from 0.85 to 0.93 g/cm$^3$ and a Melt Flow Index (ASTM D1238, 190° C., 2.16 kg) of from 0.5 to 30 g/10 min.

6. The backing layer according to claim 5, wherein the copolymer of ethylene and C3-C12-α-olefin is an ethylene-octene copolymer.

7. The backing layer according to claim 6, wherein the ethylene-octene copolymer is obtained by polymerization in the presence of a metallocene catalyst.

8. The backing layer according claim 1, wherein the functionalized elastomer (c) comprises groups that bond chemically with the polyamide.

9. The backing layer according to claim 8, wherein the groups that bond chemically with the polyamide are chosen from the group consisting of anhydrides, acids, epoxides, silanes, isocyanates, oxazolines, thiols and/or (meth)acrylates.

10. The backing layer according to claim 8, wherein the groups that bond chemically with the polyamide are chosen from the group consisting of unsaturated dicarboxylic acid anhydrides, unsaturated dicarboxylic acids, unsaturated dicarboxylic acid esters, and mixtures of two or more thereof.

11. The backing layer according to claim 8, wherein the functionalized elastomer (c) is obtained by graft polymerizing elastomer with maleic acid, maleic anhydride and/or fumaric acid.

12. The backing layer according claim 1, wherein the groups present in the second polymer composition that bond chemically and/or physically with a solar cell are chosen from the group consisting of anhydrides, acids, epoxides, silanes, isocyanates, oxazolines, thiols, (meth)acrylates, and mixtures thereof.

13. The backing layer according to claim 1, wherein the groups present in the second polymer composition that bond chemically and/or physically with a solar cell are chosen from the group consisting of silanes, epoxides, anhydrides, a combination of silanes and epoxides, or a combination of anhydrides and epoxides.

14. The backing layer according to claim 1, wherein silane groups and epoxide groups are present in the second polymer composition.

15. The backing layer according to claim 1, wherein the groups that bond chemically and/or physically with a solar cell are introduced in the second polymer composition by blending an elastomer that contains such groups into the second polymer composition.

16. The backing layer according to claim 1, wherein the amount of groups present in the second polymer composition that bond chemically and/or interact physically with a solar cell is from 0.025 to 2 wt. % (of the total weight of the second polymer composition).

17. The backing layer according to claim 1, wherein the elastomer in the second polymer composition is a copolymer of ethylene and C3-C12-α-olefin with a density of from 0.85 to 0.93 g/cm$^3$ and a Melt Flow Index (ASTM D1238, 190° C., 2.16 kg) of from 0.5 to 30 g/10 min.

18. The backing layer according to claim 17, wherein the copolymer of ethylene and C3-C12-α-olefin is an ethylene-octene copolymer.

19. A solar-cell module comprising, in order of position from the front sun-facing side to the back non-sun-facing side, a transparent pane, a front encapsulant layer, a solar cell layer comprised of one or more electrically interconnected solar cells, and a backing layer, wherein the backing layer is connected to the lower sides of the solar cells, wherein the backing layer is according to claim 1 and is positioned in such a way that the first polymer composition is at the back non-sun-facing side of the module.

20. The solar-cell module according to claim 19, wherein the solar cells in the solar cell layer are wafer-based solar cells.

\* \* \* \* \*